(12) United States Patent  (10) Patent No.: US 8,432,005 B2
Yang  (45) Date of Patent: Apr. 30, 2013

(54) METHOD AND STRUCTURE OF MONOLITHETICALLY INTEGRATED INERTIAL SENSOR USING IC FOUNDRY-COMPATIBLE PROCESSES

(75) Inventor: Xiao (Charles) Yang, Cupertino, CA (US)

(73) Assignee: Mcube, Inc., San Jose, CA (US)

( * ) Notice: Subject to any disclaimer, the term of this patent is extended or adjusted under 35 U.S.C. 154(b) by 0 days.

(21) Appl. No.: 13/494,986

(22) Filed: Jun. 12, 2012

(65) Prior Publication Data

US 2012/0248506 A1  Oct. 4, 2012

Related U.S. Application Data

(60) Division of application No. 12/717,070, filed on Mar. 3, 2010, now Pat. No. 8,227,285, which is a continuation of application No. 12/490,067, filed on Jun. 23, 2009, now abandoned.

(60) Provisional application No. 61/075,726, filed on Jun. 25, 2008.

(51) Int. Cl.
 *H01L 29/82* (2006.01)
(52) U.S. Cl.
 USPC ............ 257/414; 257/252; 257/254; 257/419

(58) Field of Classification Search .................. 257/252, 257/254, 414, 415, 417, 418, 419, 420
See application file for complete search history.

(56) References Cited

U.S. PATENT DOCUMENTS

| | | | |
|---|---|---|---|
| 2002/0072163 A1* | 6/2002 | Wong et al. | 438/200 |
| 2003/0095115 A1* | 5/2003 | Brian et al. | 345/179 |
| 2004/0140962 A1* | 7/2004 | Wang et al. | 345/179 |
| 2007/0152976 A1* | 7/2007 | Townsend et al. | 345/173 |
| 2009/0007661 A1* | 1/2009 | Nasiri et al. | 73/504.03 |
| 2009/0153500 A1* | 6/2009 | Cho et al. | 345/173 |
| 2009/0267906 A1* | 10/2009 | Schroderus | 345/173 |
| 2010/0044121 A1* | 2/2010 | Simon et al. | 178/18.03 |
| 2010/0109102 A1* | 5/2010 | Chen et al. | 257/417 |

* cited by examiner

*Primary Examiner* — Kevin M Picardat
(74) *Attorney, Agent, or Firm* — Kilpatrick Townsend & Stockton LLP

(57) ABSTRACT

The present invention relates to integrating an inertial mechanical device on top of a CMOS substrate monolithically using IC-foundry compatible processes. The CMOS substrate is completed first using standard IC processes. A thick silicon layer is added on top of the CMOS. A subsequent patterning step defines a mechanical structure for inertial sensing. Finally, the mechanical device is encapsulated by a thick insulating layer at the wafer level.
Comparing to the incumbent bulk or surface micromachined MEMS inertial sensors, the vertically monolithically integrated inertial sensors have smaller chip size, lower parasitics, higher sensitivity, lower power, and lower cost.

20 Claims, 19 Drawing Sheets

MEMS structure

Sacrificial layer patterning

WLP 1st layer

Remove sacrificial material

WLP 2<sup>nd</sup> layer, sealing

Alternative thinning method I
VIA in the 2nd wafer

Alternative thinning method II
SOI

Alternative thinning method III
Implant and cleave

Thermal or mechanical cleave, followed by surface smoothing
Mech cleave has no diffusing issue Thick mechanical layer formation // METHOD AND STRUCTURE OF MONOLITHETICALLY INTEGRATED INERTIAL SENSOR USING IC FOUNDRY-COMPATIBLE PROCESSES

CROSS-REFERENCES TO RELATED APPLICATIONS

This application is a divisional application of U.S. patent application Ser. No. 12/490,067, filed Jun. 23, 2009, which claims priority to and benefit from U.S. Provisional Patent Application No. 61/075,726, filed Jun. 25, 2008, both of which are commonly assigned and incorporated herein in their entirety by reference for all purposes.

BACKGROUND OF THE INVENTION

The present invention relates generally to monolithic techniques for micromachined technologies and integrated circuits. More particularly, the present invention provides a method and resulting device including both MEMS and integrated circuits using standard foundry compatible processes. Merely by way of example, the invention can be applied to microphones, motion sensors, rf devices, bio-systems and sensors, energy devices, pressure sensors, motors, electric generators, combinations of these, and the like.

Micromachined inertial sensors have been widely used in automotive and industrial applications for the past decades. Micromachined sensors have many advantages over macro electromechanical sensors. Micromachined devices are fabricated in a similar way as IC chips and have significant reduction in form factor. In addition, micromachined sensors have superior performance, lower power, and lower cost comparing to macro electromechanical sensors.

The incumbent micromachined inertial technologies, however, are based on MEMS fabrication processes such as bulk and surface micromachining techniques, which limit the level of integration of MEMS and CMOS, and are difficult to scale and leverage IC foundries' capability and capacity.

Thus, it is desirable to have an architecture that enables monolithically integration of MEMS on CMOS using IC foundry-compatible processes, which yields the highest performance, smallest form factor, and lowest cost comparing to the incumbent MEMS inertial sensors.

BRIEF SUMMARY OF THE INVENTION

The present invention relates to integrating an inertial mechanical device on top of a CMOS substrate monolithically using IC-foundry compatible processes. The CMOS substrate is completed first using standard IC processes. A thick silicon layer is added on top of the CMOS. A subsequent patterning step defines a mechanical structure for inertial sensing. Finally, the mechanical device is encapsulated by a thick insulating layer at the wafer level.

Comparing to the incumbent bulk or surface micromachined MEMS inertial sensors, the vertically monolithically integrated inertial sensors have smaller chip size, lower parasitics, higher sensitivity, lower power, and lower cost.

Using this architecture and fabrication flow, it is also feasible and cost-effective to make an array of inertial sensors for sensing multiple axes of accelerations on a single chip.

DETAILED DESCRIPTION OF THE INVENTION

Figure 1:
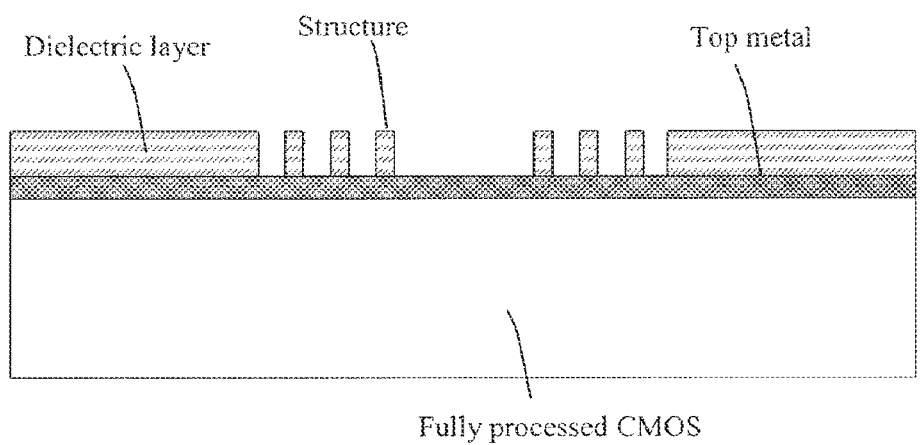
FIG. 1 is a simplified cross section diagram of components of a starting CMOS substrate according to one embodiment of the present invention.

FIG. 1 is a simplified cross section diagram of components of a starting CMOS substrate according to one embodiment of the present invention. As depicted, the starting substrate is a fully processed CMOS wafer. A dielectric layer such as oxide and nitride is deposited on top of a top metal layer of the CMOS wafer. The dielectric layer is then patterned to form a structure that provides anchor points for stationary members of the mechanical sensing device.

Figure 2:
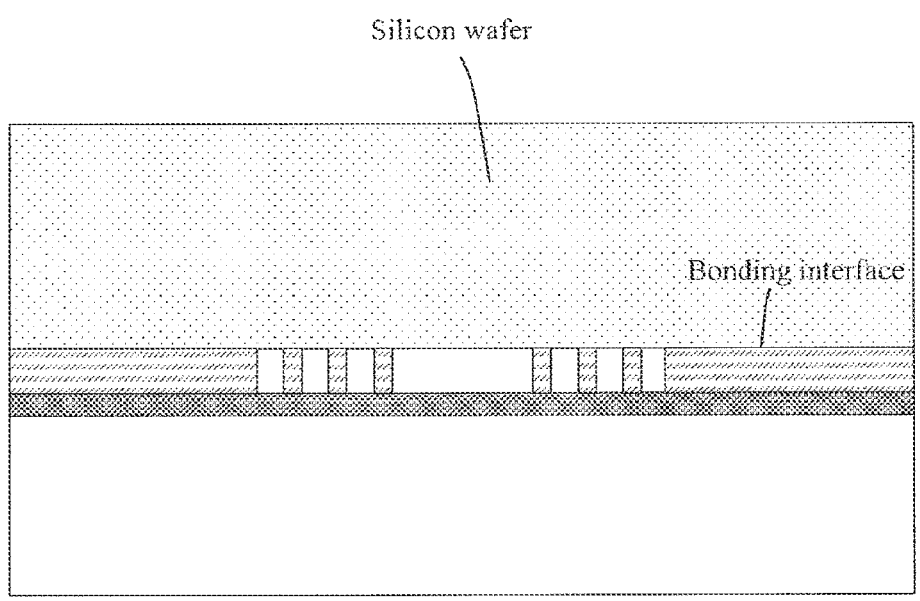
FIG. 2 is a simplified cross section diagram of components of a monolithically integrated inertial sensing device according to one embodiment of the present invention.

FIG. 2 is a simplified cross section diagram of components of a monolithically integrated inertial sensing device according to one embodiment of the present invention. As depicted, a silicon wafer is bonded to the CMOS substrate. The bonding methods include but not limited to: covalent, Sprin-on-glass (SOG), Eutectic, and anodic. The bonding temperature is CMOS compatible and below 400 C.

Figure 3:
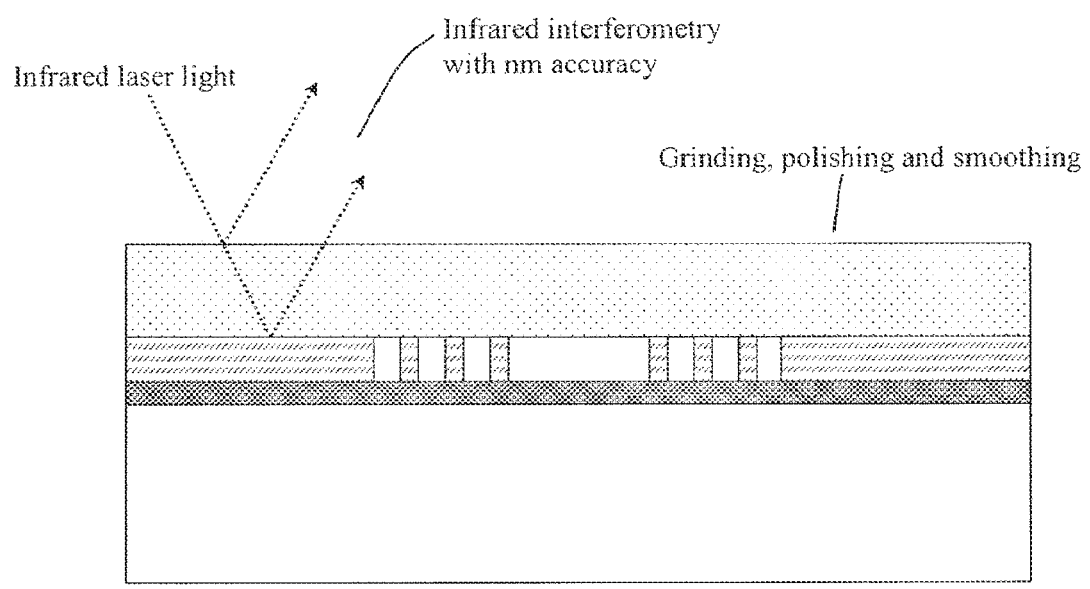
FIG. 3 is a simplified cross section diagram of components of a monolithically integrated inertial sensing device according to one embodiment of the present invention.

FIG. 3 is a simplified cross section diagram of components of a monolithically integrated inertial sensing device according to one embodiment of the present invention. As depicted, the silicon substrate is thinned by techniques such as grinding, polishing, and etching. The final thickness of the remaining silicon atop of the CMOS is precisely measured by infrared interferometry method with nanometer accuracy. Infrared wavelength is used because silicon is transparent in this spectrum.

Figure 4:
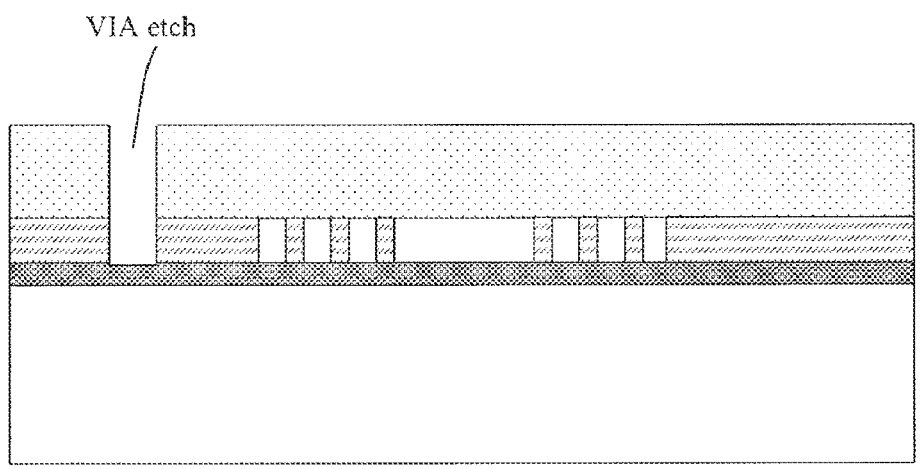
FIG. 4 is a simplified cross section diagram of components of a monolithically integrated inertial sensing device according to one embodiment of the present invention.

FIG. 4 is a simplified cross section diagram of components of a monolithically integrated inertial sensing device according to one embodiment of the present invention. As depicted, a VIA hole is etched into the silicon and top dielectric layers and stop on the top metal layer. The size of the VIA ranges from 0.5 um to a few micro meters depending on the thickness of the silicon layer. The profile or sidewall of the VIA is tapered or slopped for better step coverage of subsequent metalization step.

Figure 5:
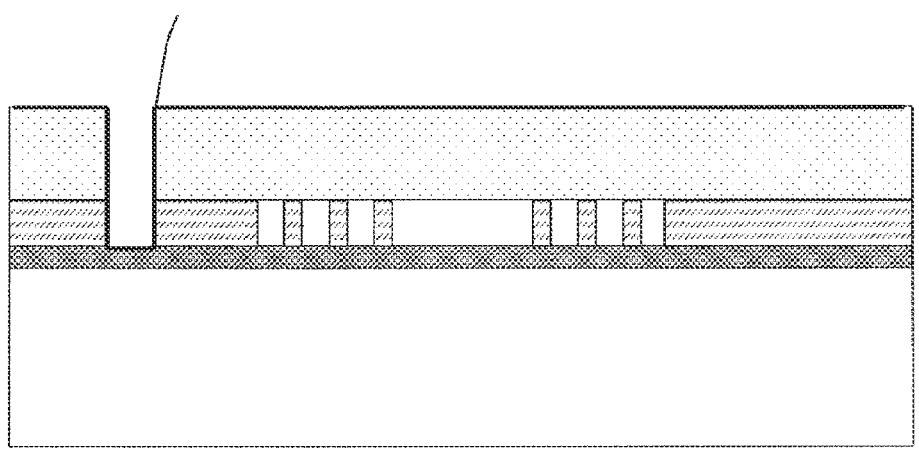
FIG. 5 is a simplified cross section diagram of components of a monolithically integrated inertial sensing device according to one embodiment of the present invention.

FIG. 5 is a simplified cross section diagram of components of a monolithically integrated inertial sensing device according to one embodiment of the present invention. As depicted, a metal layer is blanket deposited on the wafer covering the silicon surface as well as the VIA surface. CVD or PVD recipes are optimized to achieve good step coverage of the VIA as well as low stress of the metal film. In one embodiment, the metal layer is a CVD TiN material that has excellent step coverage of the VIA. The thickness of the metal ranges from a few hundreds of angstroms to a few micro meters depending the applications requirements. An optional electroplating step can be used to fill the entire VIA with metals such as Copper or Nickel.

Figure 6:
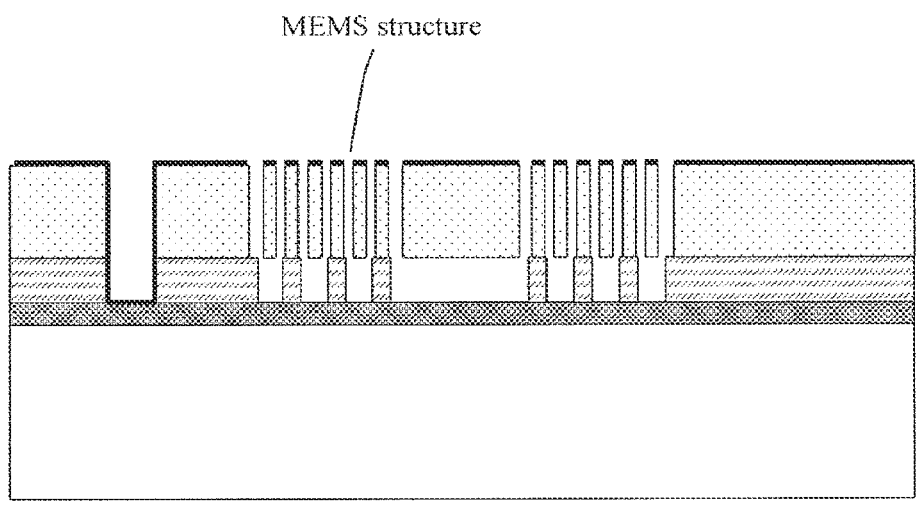
FIG. 6 is a simplified cross section diagram of components of a monolithically integrated inertial sensing device according to one embodiment of the present invention.

FIG. 6 is a simplified cross section diagram of components of a monolithically integrated inertial sensing device according to one embodiment of the present invention. As depicted, the silicon layer is patterned typically by a DRIE step. For a capacitive inertial sensor, the mechanical structure includes a proof mass connected with springs, movable comb fingers and stationary comb fingers that anchored to the top oxide. The springs have desired stiffness/compliance that allows the proof mass to move at certain external acceleration. The comb fingers moving along with the proof mass couples to stationary comb fingers capacitively. The movement cause a change in capacitance between the movable comb fingers and stationary comb fingers. The capacitance change is detected by the integrated circuits a few micrometer below.

Figure 7:
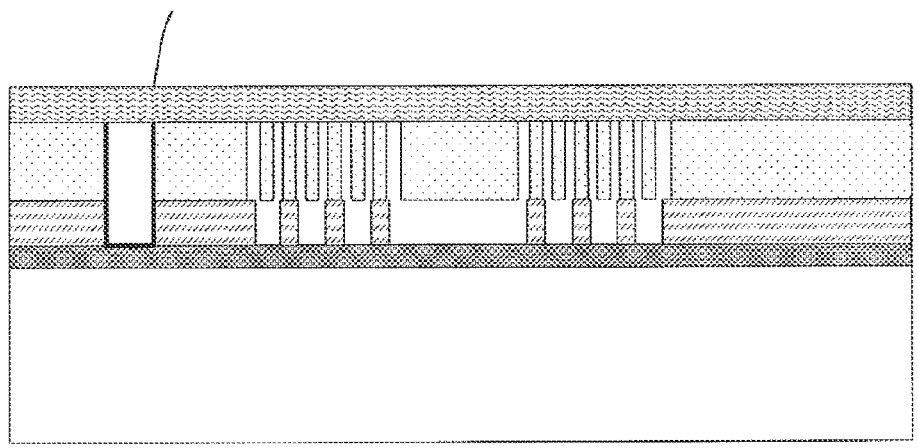
FIG. 7 is a simplified cross section diagram of components of a monolithically integrated inertial sensing device according to one embodiment of the present invention.

FIG. 7 is a simplified cross section diagram of components of a monolithically integrated inertial sensing device according to one embodiment of the present invention. As depicted, an organic sacrificial material is deposited covering the mechanical structure. In one embodiment, the sacrificial material is a liquid photo resist that is spin coated on the wafer and fill all the VIA holes and trenches. In another embodiment, the sacrificial material is a dry film photoreisit that is deposited on the surface of the wafer and does not fill the holes and trenches.

Figure 8:
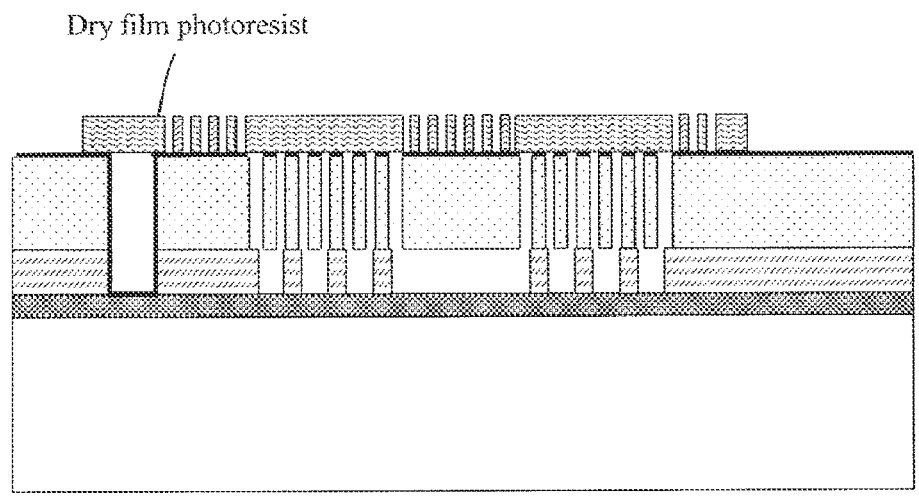
FIG. 8 is a simplified cross section diagram of components of a monolithically integrated inertial sensing device according to one embodiment of the present invention.

FIG. 8 is a simplified cross section diagram of components of a monolithically integrated inertial sensing device according to one embodiment of the present invention. As depicted, the photo resist is patterned by an exposure and develop lithography process. The exposed area are non-trench features such as proof mass and anchors.

Figure 9:
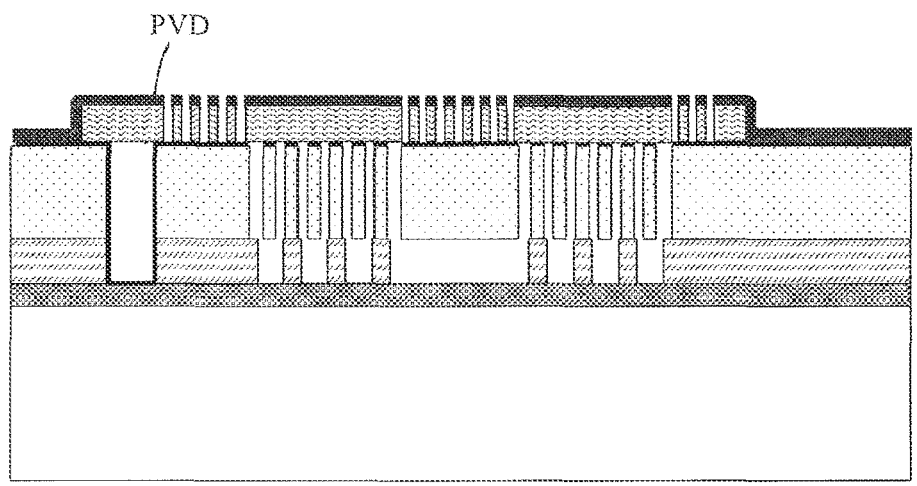
FIG. 9 is a simplified cross section diagram of components of a monolithically integrated inertial sensing device according to one embodiment of the present invention.

FIG. 9 is a simplified cross section diagram of components of a monolithically integrated inertial sensing device according to one embodiment of the present invention. As depicted, the $1^{st}$ layer of the encapsulation is deposited by a PVD process. The deposition recipe is optimized for non-conforming purpose, which has little step coverage of the sidewall of the exposed photoresist trenches.

Figure 10:
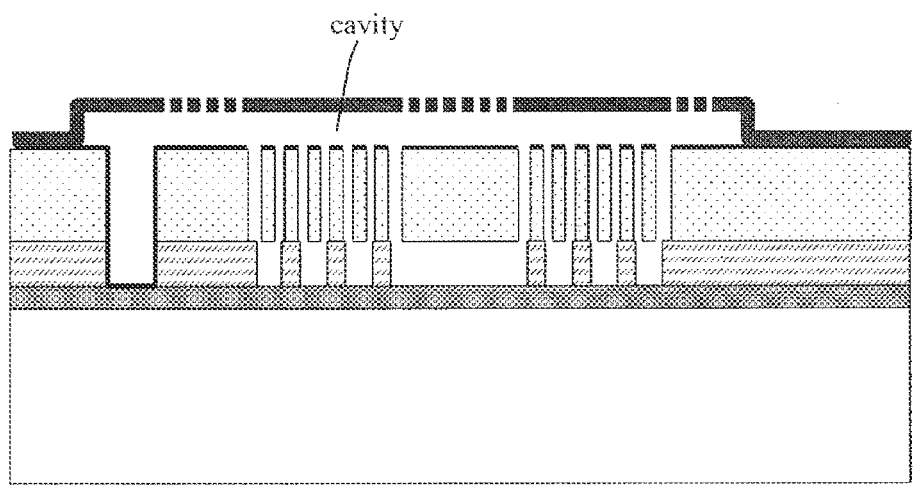
FIG. 10 is a simplified cross section diagram of components of a monolithically integrated inertial sensing device according to one embodiment of the present invention.

FIG. 10 is a simplified cross section diagram of components of a monolithically integrated inertial sensing device according to one embodiment of the present invention. As depicted, the sacrificial organic material is then removed by a dry O2 plasma ashing step. The removal of the sacrificial material releases the sensor device and forms the $1^{st}$ shell of the encapsulation.

Figure 11:
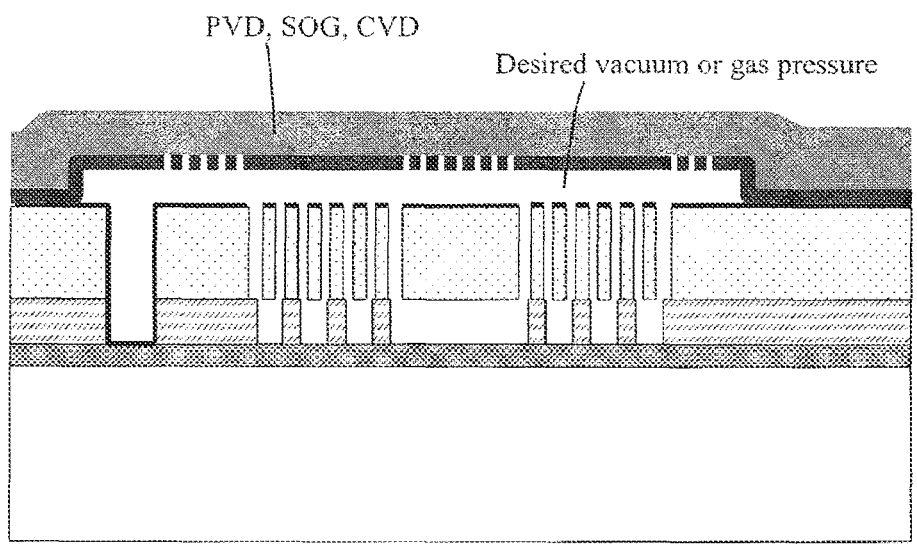
FIG. 11 is a simplified cross section diagram of components of a monolithically integrated inertial sensing device according to one embodiment of the present invention.

FIG. 11 is a simplified cross section diagram of components of a monolithically integrated inertial sensing device according to one embodiment of the present invention. As depicted, the $2^{nd}$ layer of the encapsulation is deposited onto the $1^{st}$ layer. The sealing methods include PVD, spin-on, or spray-on techniques. The sealing materials include metal such as Ti, TiN, amorphous silicon, spin-on-glass, spray-on-glass, or a combination of the above. The ambient during sealing is optimized and controlled to a desired spec that defines the sensor device ambient after sealing. A getter material such as Ti can be deposited as the $1^{st}$ layer of the encapsulation and activated later to achieve high vacuum and cleanness of the sensor ambient environment. After sealing the holes, an optional CVD dielectric material such as oxide or nitride can be added onto the encapsulation.

Figure 12:
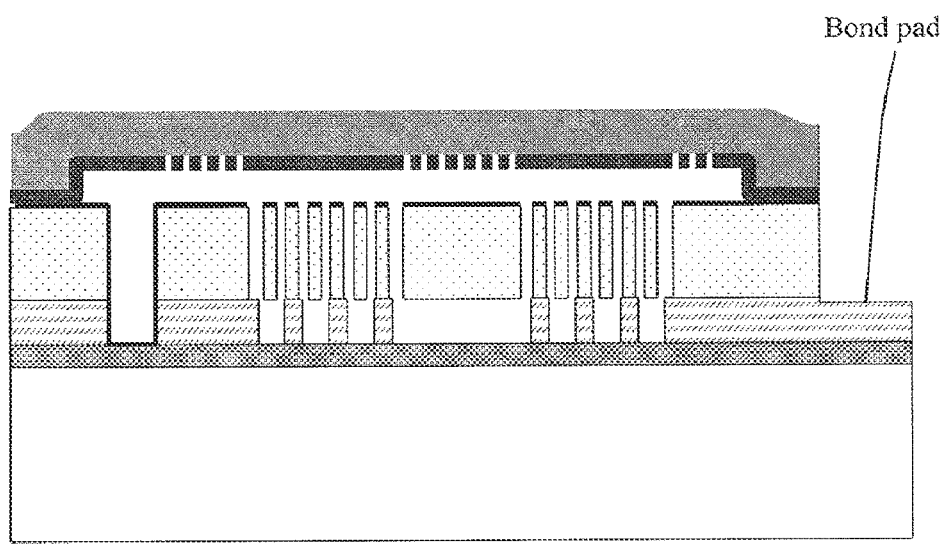
FIG. 12 is a simplified cross section diagram of a components of a monolithically integrated inertial sensing device according to one embodiment of the present invention.

FIG. 12 is a simplified cross section diagram of components of a monolithically integrated inertial sensing device according to one embodiment of the present invention. As shown, a bond pad structure is formed. The bond pad structure can be formed by pattern and etch techniques known in the art, but can also be others depending on the application.

Figure 13A:
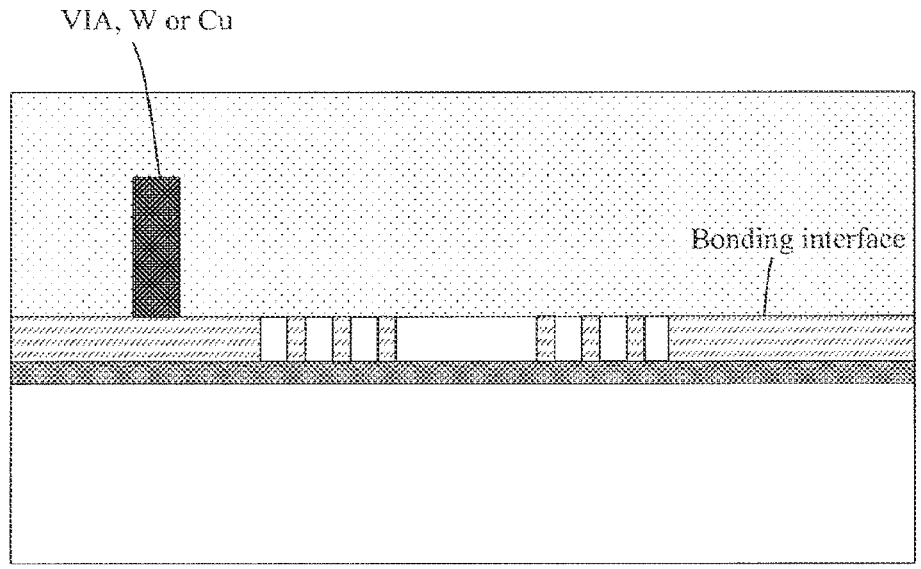
FIGS. 13A and 13B are simplified cross section diagrams of an alternative method of controlling silicon layer thickness of a monolithically integrated inertial sensing device according to one embodiment of the present invention.
Figure 13B:
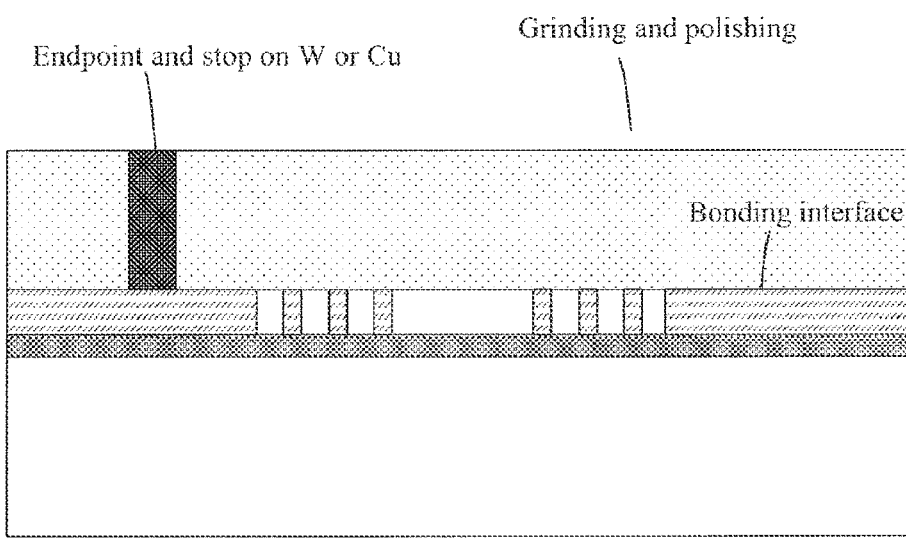

FIGS. 13A and 13B are simplified cross section diagrams of an alternative method of controlling silicon layer thickness of a monolithically integrated inertial sensing device according to one embodiment of the present invention. As depicted in FIG. 13A, a VIA structure is formed in a desired depth in the silicon substrate prior to bonding. The VIA is filled with materials such as Copper or Tungsten. As illustrated in FIG. 13B, the VIA is exposed during the thinning step and provide an end-point signal that control the remaining silicon thickness.

Figure 14A:
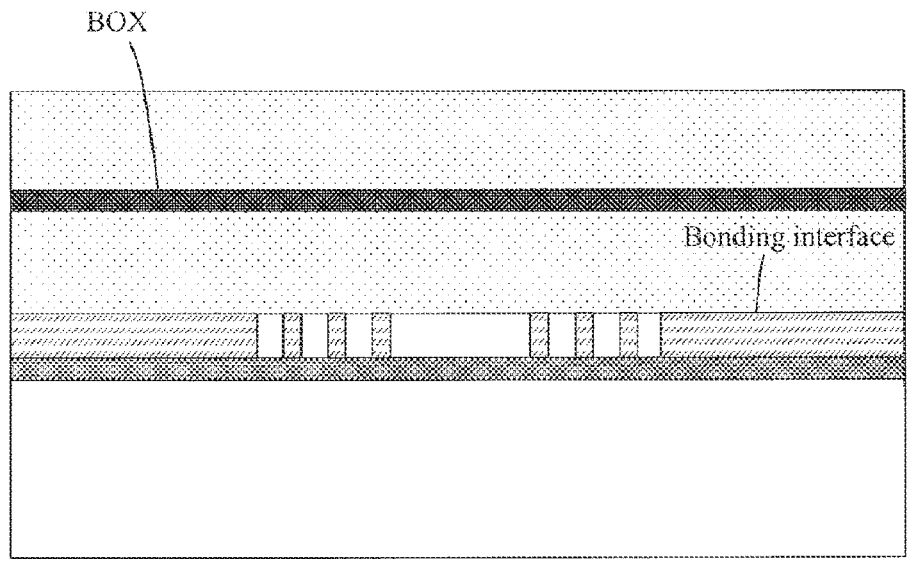
FIGS. 14A and 14B are simplified cross section diagrams of an alternative method of controlling silicon layer thickness of a monolithically integrated inertial sensing device according to one embodiment of the present invention.
Figure 14B:
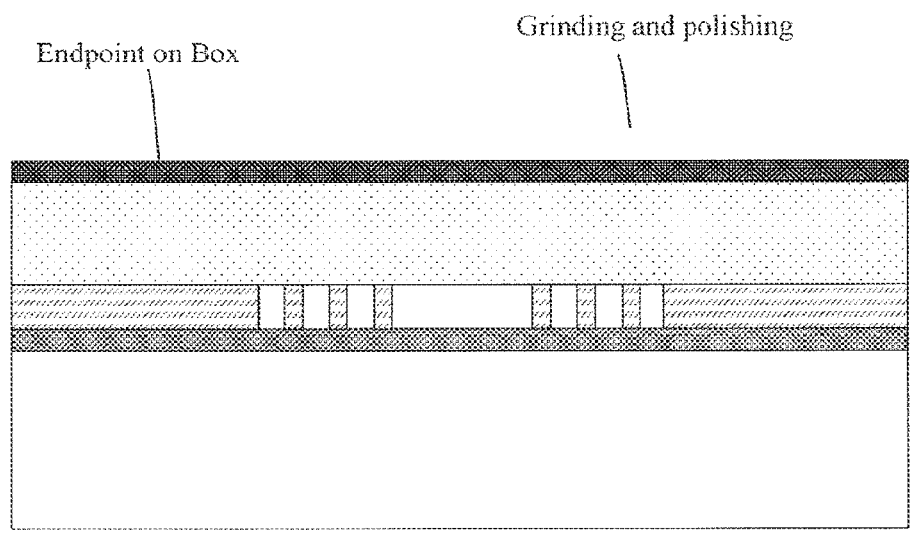

FIGS. 14A and 14B are simplified cross section diagrams of an alternative method of controlling silicon layer thickness of a monolithically integrated inertial sensing device according to one embodiment of the present invention. As depicted in FIG. 14A, the blanket silicon wafer is a SOI wafer with a desired SOI thickness. As illustrated in FIG. 14B, the BOX of the SOI provides an etch stop during the thinning process steps. The BOX can be then used as a hard mask to define the sensor structure.

Figure 15A:
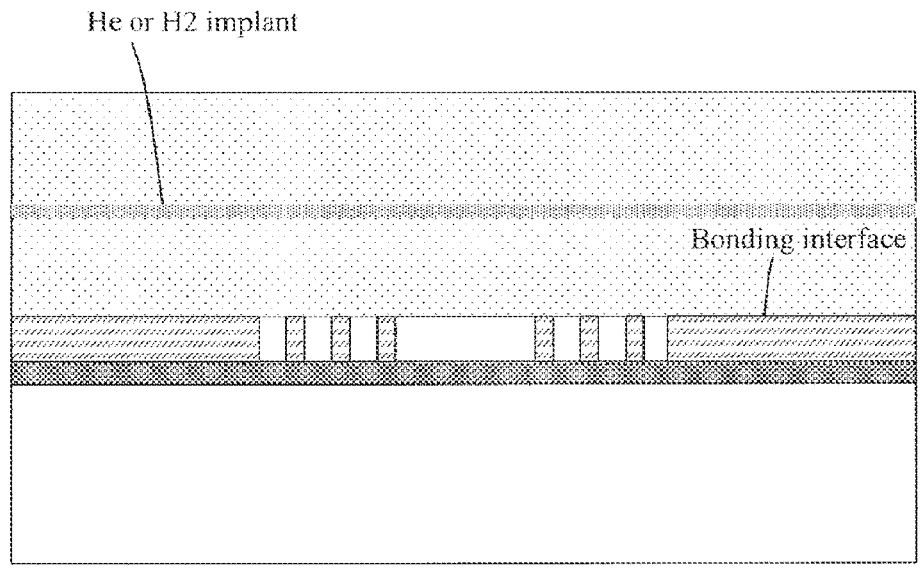
FIGS. 15A and 15B are simplified cross section diagrams of a alternative method of controlling silicon layer thickness of a monolithically integrated inertial sensing device according to one embodiment of the present invention.
Figure 15B:
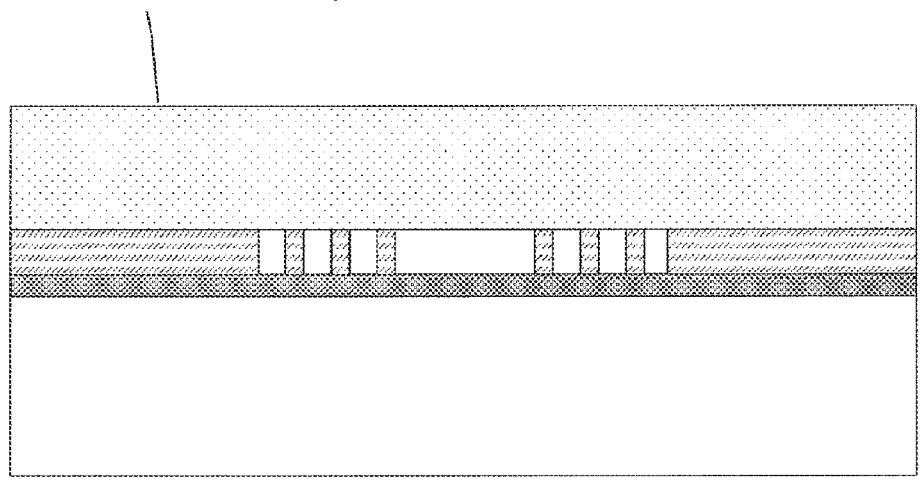

FIGS. 15A and 15B are simplified cross section diagrams of a alternative method of controlling silicon layer thickness of a monolithically integrated inertial sensing device according to one embodiment of the present invention. As depicted in FIG. 15A, the blanket silicon wafer has a layer of implanted H2, He, or Ar in a desired thickness in the silicon substrate. As illustrated in FIG. 15B, this thickness of silicon is separated from the bulk at the implant layer. Separation methods include thermal cleave and mechanical cleave. A subsequent polishing or etching step smoothens the cleaved surface of the remaining silicon layer.

Figure 16A:
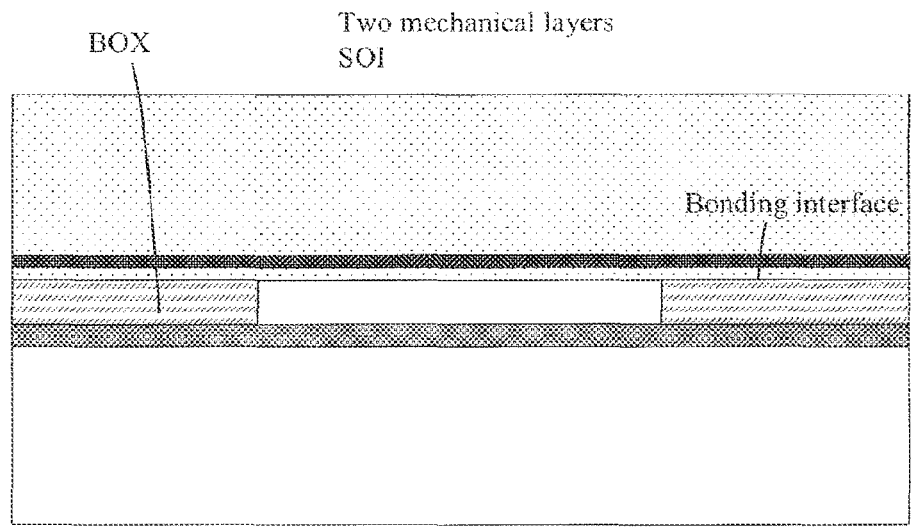
FIGS. 16A, 16B, and 16C are simplified cross section diagrams of double mechanical layer architecture of a monolithically integrated inertial sensing device according to one embodiment of the present invention.
Figure 16B:
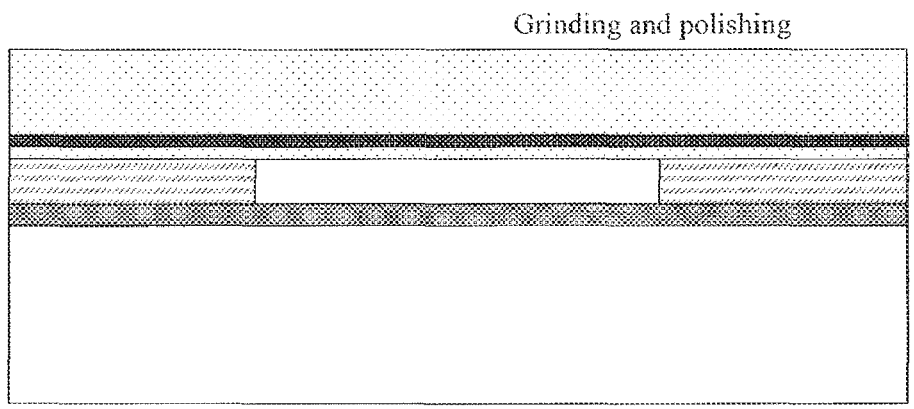
Figure 16C:
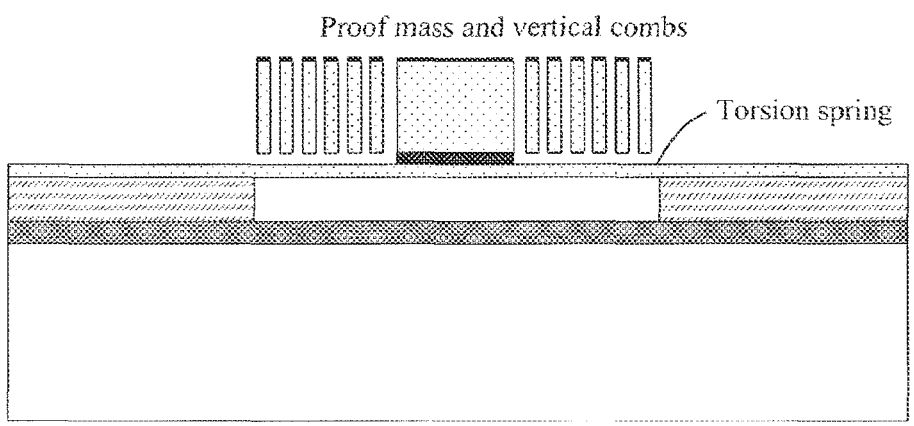

FIGS. 16A, 16B, and 16C are simplified cross section diagrams of double mechanical layer architecture of a monolithically integrated inertial sensing device according to one embodiment of the present invention. As depicted in FIG. 16A, the blanket silicon substrate is a SOI wafer with desired SOI thickness. After the bonding, a thinning process is followed to defined a desired thickness of the remained silicon in the bulk portion of the SOI substrate as illustrated in FIG. 16B. The thickness control techniques include methods aforementioned, Infrared interferometery, VIA end-point, or double SOI substrate. As shown in FIG. 16C, the sensor structure is then defined by etching steps. With double layered mechanical structure, various configurations can be designed to achieve desired performance. In one embodiment, the SOI is a thin layer with submicron thickness that provides as torsional springs for out-of-plane movement of the proof mass. In another embodiment, the thin SOI layer defines a flat spring that is compliant in the vertical dimension for Z-axis linear acceleration sensing, for example. In short, dual-layer mechanical structure gives more design flexibility and freedom for inertial sensor design.

Figure 17A:
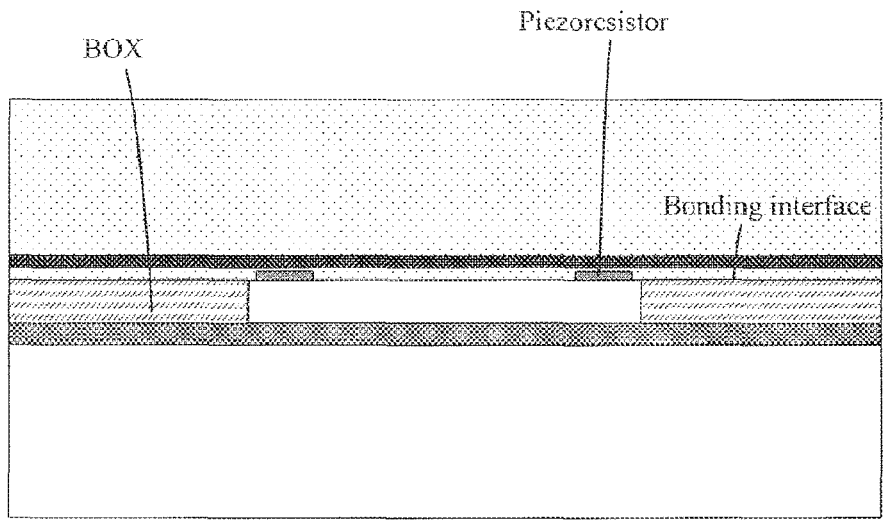
FIGS. 17A, 17B, and 17C are simplified cross section diagrams of double mechanical layer architecture of a monolithically integrated inertial sensing device according to one embodiment of the present invention.
Figure 17B:
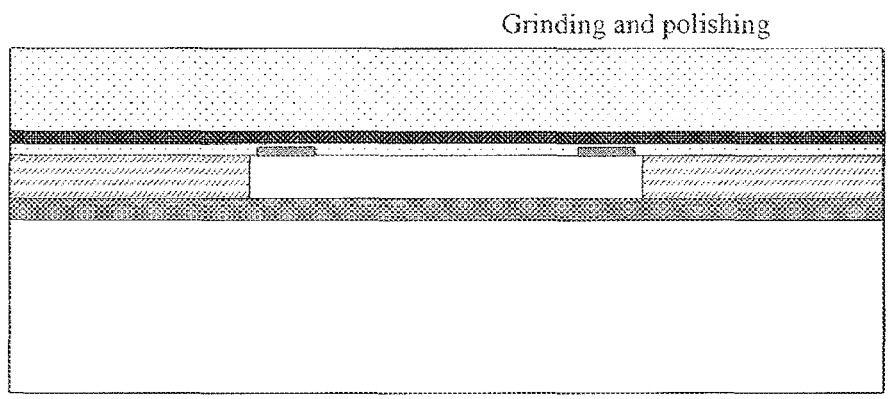
Figure 17C:
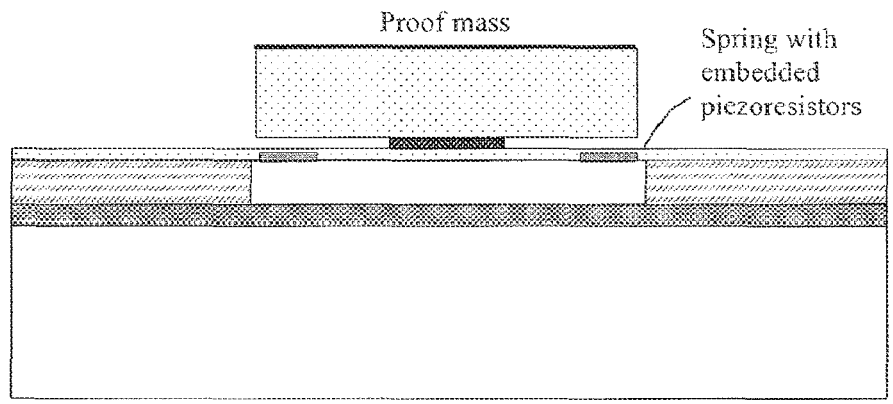

FIGS. 17A, 17B, and 17C are simplified cross section diagrams of double mechanical layer architecture of a monolithically integrated inertial sensing device according to one embodiment of the present invention. As depicted in FIG. 17A, piezoresistors are embedded in the SOI substrate prior to bonding. After the bonding, a thinning process is followed to defined a desired thickness of the remained silicon in the bulk portion of the SOI substrate as illustrated in FIG. 17B. The thickness control techniques include methods aforementioned, Infrared interferometery, VIA end-point, or double SOI substrate. As shown in FIG. 17C, the sensor structure is then defined by etching steps. The spring member is formed in the SOI layer with the piezoresistors located in the mostly sensitive region. As the proof mass moves responding to an external acceleration, the springs deforms accordingly. As a result, the strain generated in the springs change the resistance of the piezoresistors. The change in resistance is detected by the integrated circuits a few micron below.

Figure 18:
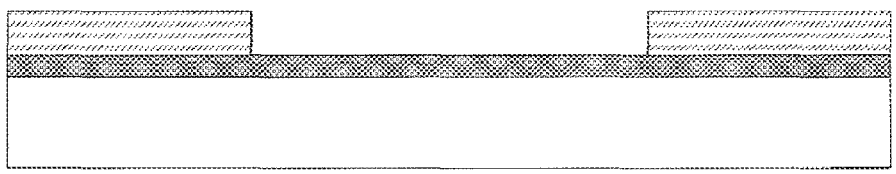
FIG. 18 is a simplified cross section diagram of process flow of a monolithically integrated inertial sensing device according to one embodiment of the present invention.
Figure 18:
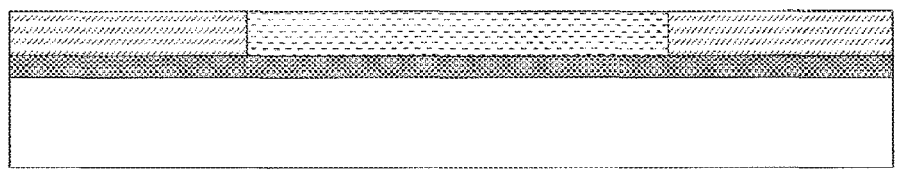
Figure 18:
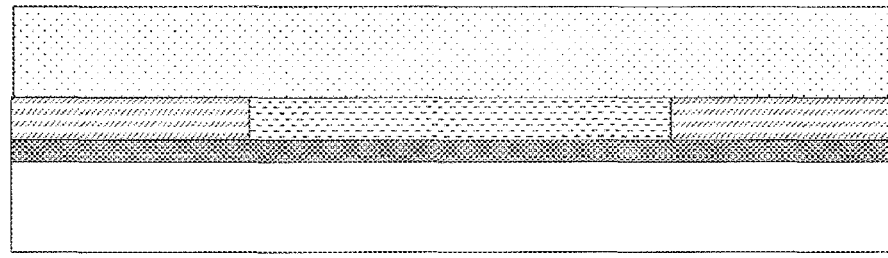
Figure 18:
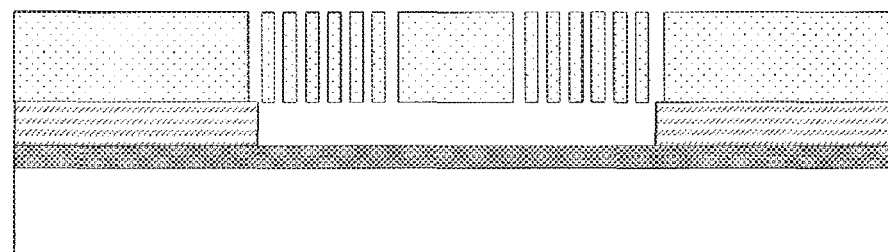
Figure 18:
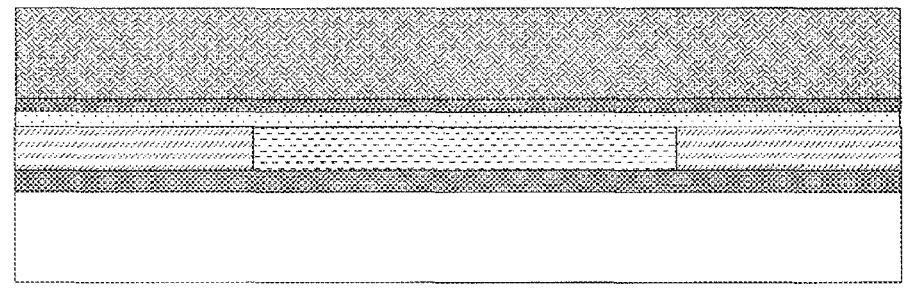

FIG. 18 is a simplified cross section diagram of process flow of a monolithically integrated inertial sensing device according to one embodiment of the present invention. As depicted, a mechanical layer is formed by the follows: 1) defining cavity in the CMOS substrate, 2) fill the cavity with sacrificial organic material, 3) deposit mechanical material such as metal, amorphous silicon ranging from few micron to 10 s of microns, 4) define sensor structure and remove sacrificial material. Using this process flow, multiple mechanical structure layers can be defined. For example, a dielectric layer can be added between the 1$^{st}$ the 2$^{nd}$ mechanical layer deposition.

Figure 19:
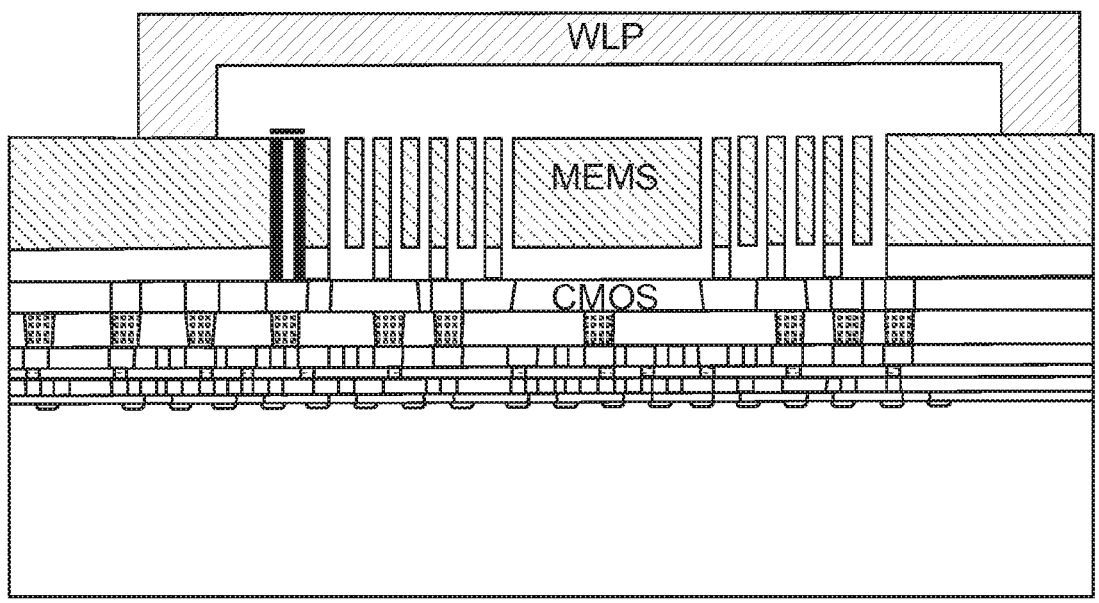
FIG. 19 is a simplified cross section diagram of components of a monolithically integrated inertial sensing device according to one embodiment of the present invention.

FIG. 19 is a simplified cross section diagram of components of a monolithically integrated inertial sensing device according to one embodiment of the present invention. As depicted, the MEMS and WLP layers are stacked on top of the CMOS layers vertically and have similar cost structure as the CMOS layers. Since MEMS and WLP typically require thick material, additional material layer costs are added to the mask layers. This architecture leverages IC foundries' infrastructure, capability, and process control to achieve high yield. It can also take advantage of IC foundry's 'older' technology nodes' low cost and enormous capacity to make MEMS devices in high volume and at low cost.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A monolithic MEMS and CMOS integrated circuit device comprising:
   a first semiconductor substrate having a first surface region;
   one or more CMOS integrated circuit devices provided on a CMOS integrated circuit device region overlying the first surface region, the CMOS integrated circuit device region having a CMOS surface region;
   a dielectric region overlying the CMOS surface region, the dielectric region having a cavity region provided therein;
   a second semiconductor substrate having a second surface region overlying the dielectric region and enclosing the cavity region, the second semiconductor substrate having a spring region overlying a vicinity of the cavity region;
   a first piezo resistor device provided within a first portion of the spring region of the second semiconductor substrate;
   a second piezo resistor device provided within a second portion of the spring region of the second semiconductor substrate; and
   a mass of material coupled to a portion of the spring region of the second semiconductor substrate between the second piezo resistor device and the first piezo resistor device, the mass material being overlying the cavity region and coupled to the spring region to be movable from at least a first position to a second position and to be sensed respectively by either or both the first piezo resistor device and the second piezo resistor device.

2. The device of claim 1 wherein the dielectric layer comprises one or more patterned regions.

3. The device of claim 1 wherein the second semiconductor comprises a desired thickness and a polished surface region.

4. The device of claim 3 wherein the second semiconductor comprises one or more via structures formed within one or more portions of the second semiconductor substrate.

5. The device of claim 4 wherein the one or more via structures extend from the second surface region to a vicinity of the desired thickness.

6. The device of claim 4 wherein the one or more via structures are configured as stop structures.

7. The device of claim 4 wherein the second semiconductor substrate comprises an SOI substrate having a bulk portion, overlying insulating layer, and single crystal device layer.

8. The device of claim 4 further comprising an enclosure layer overlying the first and second piezo resistor devices.

9. The device of claim 8 wherein the enclosure layer comprises a titanium material, the titanium material being activated as a getter layer.

10. The device of claim 8 wherein the enclosure layer is selected from a group consisting of: a metal, a semiconductor material, an amorphous silicon material, a dielectric layer, or a combination of these layers.

11. The device of claim 8 wherein the enclosure layer comprises an open region between the first and second piezo resistor devices and the enclosure layer.

12. The device of claim 11 further comprising an encapsulating layer overlying the enclosure layer, the encapsulating layer substantially sealing the first and second piezo resistor devices to form a predetermined environment within the open region.

13. The device of claim 12 wherein the encapsulating layer is selected from a group consisting of: a metal layer, a spin on glass, spray on glass, amorphous silicon, a dielectric layer, or any combination of these layers.

14. The device of claim 12 wherein the predetermined environment comprises an inert gas at a determined pressure.

15. A monolithic MEMS and CMOS integrated circuit device comprising:
   a first semiconductor substrate having a first surface region;
   one or more CMOS integrated circuit devices provided on a CMOS integrated circuit device region overlying the first surface region, the CMOS integrated circuit device region having a CMOS surface region;
   a dielectric region overlying the CMOS surface region, the dielectric region having a cavity region provided therein;
   a second semiconductor substrate having a second surface region overlying the dielectric region and enclosing the cavity region, the second semiconductor substrate having a spring region overlying a vicinity of the cavity region;
   one or more free standing MEMS structures formed within one or more portions of the second semiconductor substrate;
   a mass of material coupled to a portion of the spring region of the second semiconductor substrate, the mass material being overlying the cavity region and coupled to the spring region to be movable from at least a first position to a second position and to be sensed by the one or more free standing MEMS structures;
   an enclosure layer overlying the one or more free standing MEMS structures, the enclosure layer comprising an open region between the free standing MEMS structures and the enclosure layer; and
   an encapsulating layer overlying the enclosure layer, the encapsulating layer substantially sealing the one or more free standing MEMS structures to form a predetermined environment within the open region.

16. The device of claim 15 wherein the second semiconductor substrate comprises an SOI substrate having a bulk portion, overlying insulating layer, and single crystal device layer.

17. The device of claim 15 wherein the enclosure layer comprises a titanium material, the titanium material being activated as a getter layer.

18. The device of claim 15 wherein the enclosure layer is selected from a group consisting of: a metal, a semiconductor material, an amorphous silicon material, a dielectric layer, or a combination of these layers.

19. The device of claim 15 wherein the encapsulating layer is selected from a group consisting of: a metal layer, a spin on glass, spray on glass, amorphous silicon, a dielectric layer, or any combination of these layers.

20. A monolithic MEMS and CMOS integrated circuit device comprising:
   a first semiconductor substrate having a first surface region;
   one or more CMOS integrated circuit devices provided on a CMOS integrated circuit device region overlying the first surface region, the CMOS integrated circuit device region having a CMOS surface region;
   a dielectric region overlying the CMOS surface region, the dielectric region having a cavity region provided therein;
   a second semiconductor substrate having a second surface region overlying the dielectric region and enclosing the cavity region, the second semiconductor substrate having a spring region overlying a vicinity of the cavity region;
   a first piezo resistor device provided within a first portion of the spring region of the second semiconductor substrate;
   a second piezo resistor device provided within a second portion of the spring region of the second semiconductor substrate;
   a mass of material coupled to a portion of the spring region of the second semiconductor substrate between the second piezo resistor device and the first piezo resistor device, the mass material being overlying the cavity region and coupled to the spring region to be movable from at least a first position to a second position and to be sensed respectively by either or both the first piezo resistor device and the second piezo resistor device;
   an enclosure layer overlying the first and second piezo resistor devices, the enclosure layer comprising an open region between the first and second piezo resistor devices and the enclosure layer; and
   an encapsulating layer overlying the enclosure layer, the encapsulating layer substantially sealing the first and second piezo resistor devices to form a predetermined environment within the open region.

* * * * *